United States Patent [19]
Berar

[11] Patent Number: 6,031,387
[45] Date of Patent: Feb. 29, 2000

[54] SEMICONDUCTOR TEST SYSTEM WITH INTEGRATED TEST HEAD MANIPULATOR AND DEVICE HANDLER

[75] Inventor: Andrei Berar, Campbell, Calif.

[73] Assignee: Credence Systems Corporation, Fremont, Calif.

[21] Appl. No.: 08/982,986

[22] Filed: Dec. 2, 1997

[51] Int. Cl.[7] .................................................. G01R 31/26
[52] U.S. Cl. ............................................ 324/765; 324/754
[58] Field of Search ..................................... 324/754, 755, 324/765, 758

[56] References Cited

U.S. PATENT DOCUMENTS

| | | | |
|---|---|---|---|
| 4,574,235 | 3/1986 | Kelly et al. | 324/754 |
| 5,091,693 | 2/1992 | Berry et al. | 324/754 |
| 5,510,724 | 4/1996 | Itoyama et al. | 324/760 |
| 5,546,405 | 8/1996 | Golla | 371/22.1 |
| 5,644,245 | 7/1997 | Saitoh et al. | 324/754 |
| 5,754,057 | 5/1998 | Hama et al. | 324/754 |

*Primary Examiner*—Josie Ballato
*Assistant Examiner*—Russell M. Kobert
*Attorney, Agent, or Firm*—Smith-Hill and Bedell

[57] ABSTRACT

A semiconductor integrated circuit test system, for testing semiconductor integrated circuit devices includes a test head containing pin electronics circuits and a device handler for receiving semiconductor integrated circuit devices to be tested and delivering the devices to a test station for engagement with the test head. The device handler includes a mechanical support structure, a test head manipulator having a first part rigidly attached to the mechanical support structure, a second part which is movable relative to the first part and to which the test head is attached, and a motor effective between the first and second parts of the manipulator for moving the second part relative to the first part. A power server is attached to the device handler independently of the test head manipulator. A cable connects the power server to the pin electronics circuits of the test head.

9 Claims, 2 Drawing Sheets

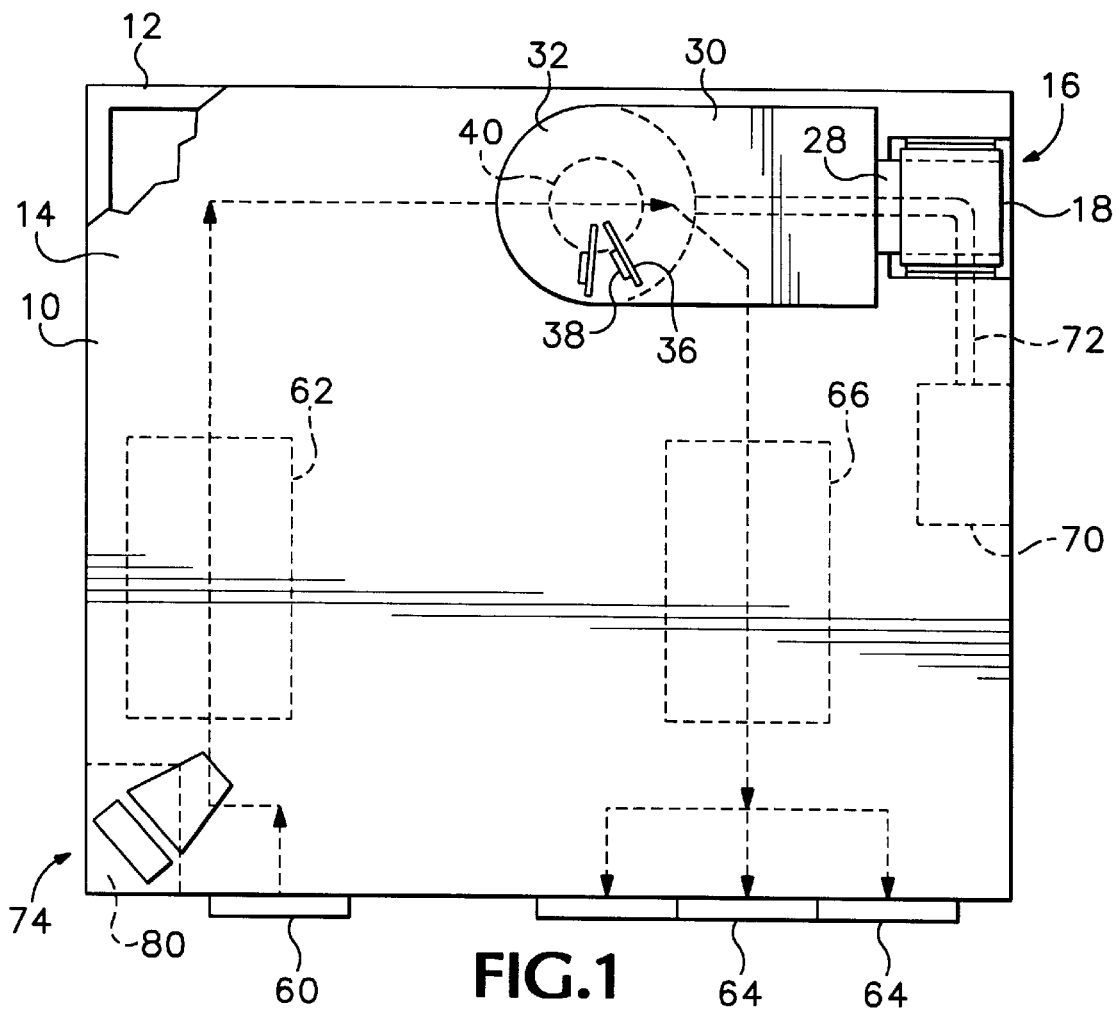
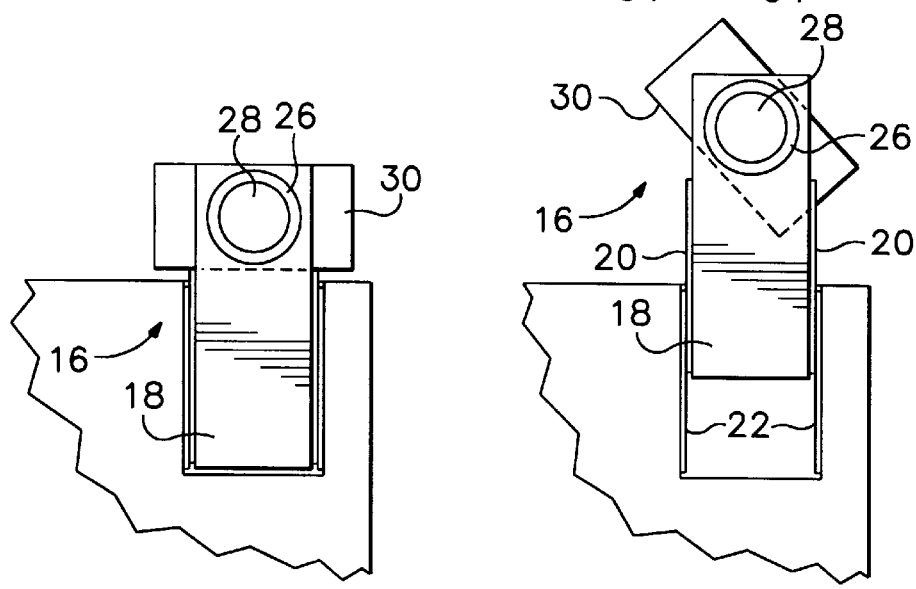
FIG. 1
FIG. 2A  FIG. 2B

SEMICONDUCTOR TEST SYSTEM WITH INTEGRATED TEST HEAD MANIPULATOR AND DEVICE HANDLER

BACKGROUND OF THE INVENTION

This invention relates to a semiconductor test system with compact configuration.

A conventional semiconductor test system for testing semiconductor integrated circuit devices in packaged form includes a handler, a test head, a stand-alone manipulator and a power server.

The test head includes tester pins which are mounted in the test head on pin cards and are connected to respective pin electronics circuits. The pin electronics circuits generate stimulus signals for application to input pins of the device under test (DUT) and test or measure response signals provided at output pins of the DUT.

For testing, the DUT is fitted in a socket which is attached to a DUT board mounted in the handler. Generally, the test system is configured so that for normal testing the test head is positioned with its DUT engagement face, at which the tester pins are exposed, toward the DUT board. The tester pins engage the DUT board, which makes electrical connections between tester pins in the test head and the DUT.

The handler receives the packaged devices in containers, such as trays, at an input station, removes the devices from the tray and delivers them to a test station. At the test station, the packaged devices are displaced into engagement with the socket and the device is tested. After a device has been tested, the handler disengages the device from the socket. The handler removes the tested device from the test station and delivers it to an output station. At the output station, each tested device is placed in one of several trays on the basis of the test result. The trays are removed from the handler for further processing of the devices.

In the conventional test system, the weight of the test head is supported by the stand-alone manipulator, which is distinct from the device handler. The manipulator is able to adjust the position of the test head relative to the handler in three linear degrees of freedom and three rotational degrees of freedom. This allows the manipulator to be used with different test heads and different handlers, each having different requirements regarding positioning the test head relative to the handler.

It has hitherto been conventional to fabricate the pin electronics circuits of a semiconductor test system using an integrated circuit technology, such as TTL technology, that results in the pin electronics circuits of the conventional test systems being bulky and having high power consumption. These two factors have necessitated that the pin electronics circuits be accommodated in the power server, which is separate from the test head and is provided with means for cooling the pin electronics circuits. The power server is connected to the test head by a cable composed of several signal wires for each pin of the test head. For example, if the test head has 256 pins, the cable may have 512 or more signal wires. The cable may also contain spare signal wires, against the possibility of wires being damaged, and it may also include power lines. Since the signal wires may have to conduct signals at high frequencies, the signal wires must also be shielded, which is accomplished by including ground wires in the cable. The cable is therefore exceedingly bulky and heavy and measures must be taken to support the cable between the server and the test head. Generally, this has involved the power server being associated closely with the manipulator since the manipulator can then be used to support the cable.

Because the pin electronics circuits of the conventional test system require cooling facilities and are accommodated in the power server, the power server of the conventional test system is very bulky.

The power server of the conventional semiconductor test system has a user interface, including a keyboard and a display monitor, to allow the operator to control operation of the power server.

A device handler that is currently available is the MCT 7632 Fine Pitch Device Handler manufactured by Micro Component Technology, Inc. of Shore View, Minn. This handler is generally rectangular when viewed in plan and occupies an area about 2 m×1.7 m. The input and output stations are located near one of the long sides of the handler and the test station is located near the other long side of the handler. The handler includes a computer which controls operation of the handler. A user interface for the handler computer, including a keyboard and display monitor, is located adjacent the input station so that the operator can observe loading of devices into the handler while at the user interface of the handler computer. The MCT 7632 Fine Pitch Device Handler includes a sturdy mechanical support structure which supports the functional components of the handler.

The mechanical support structure of the MCT 7632 Fine Pitch Device Handler includes a frame and a shell. The geometry of the shell defines the external dimensions of the handler. Several functional components of the handler, such as handler computer, are accommodated inside the shell. However, the interior space of the shell is not completely filled with functional components of the handler, so that there are several vacant spaces inside the shell. This feature allows some flexibility in locating components inside the shell. For example, possible locations for the processing unit of the handler computer include a location about half way along one of the short sides of the handler and a location adjacent the input station.

When the MCT 7632 Fine Pitch Device Handler is used in conjunction with a conventional manipulator and power server, the manipulator is positioned for supporting the test head over the test station and guiding the cable from the power server to the test head. The cable must be long enough to accommodate a wide range of movement of the test head without creating any sharp bends in the cable, which implies that the cable must be quite long. This leads to the power server typically being at a substantial distance, e.g. at least 1 m, from the handler. Accordingly, the envelope of the test system covers an area about 2.7 m×2 m.

More recently, test systems have been built with CMOS pin electronic circuits, which are less bulky and operate at lower power levels than their TTL counterparts, and this has allowed the pin electronics circuits to be accommodated in the test head. In this type of test system, the cable connecting the power server to the test head does not need to contain several signal wires for each pin, in addition to power supply lines, but can instead contain a bus which supplies instructions to the pin electronics circuits. The cable used with a test system having CMOS pin electronics circuits in the test head is therefore much lighter and less bulky than the cable used with a TTL power server.

In addition, in a test system employing CMOS pin electronics circuits in the test head, the power server can be made very much more compact than the conventional TTL power server, since it is not necessary to accommodate either the pin electronics circuits or cooling facilities for the pin electronics circuits.

The cost of testing a semiconductor integrated circuit device can be a significant component of the total cost of producing the device. Part of the cost of test is the cost of providing the physical resources required to accommodate the test system and the cost of providing the physical resources depends on the floor area occupied by the test system. Since it is generally necessary to accommodate the test system in a clean room, and the cost per unit floor area of a clean room is quite high, it is desirable that the floor area occupied by the test system be minimized. In the conventional test system, the floor area occupied by the entire test system is substantially greater than the floor area occupied by the handler alone because the manipulator and power server are outside the footprint of the device handler.

SUMMARY OF THE INVENTION

Since the cable of the CMOS test system does not require special support measures, the power server is rendered independent of the manipulator and the manipulator is independent of the cable.

According to the present invention there is provided a semiconductor integrated circuit test system, for testing semiconductor integrated circuit devices, comprising a test head containing pin electronics circuits, a device handler for receiving semiconductor integrated circuit devices to be tested and delivering the devices to a test station for engagement with the test head, the device handler including a mechanical support structure, a test head manipulator having a first part rigidly attached to the mechanical support structure, a second part which is movable relative to the first part and to which the test head is attached, and a motor effective between the first and second parts of the manipulator for moving the second part relative to the first part, a power server attached to the device handler independently of the test head manipulator, and a cable connecting the power server to the pin electronics circuits of the test head.

BRIEF DESCRIPTION OF THE DRAWINGS

For a better understanding of the invention, and to show how the same may be carried into effect, reference will now be made, by way of example, to the accompanying drawings, in which FIG. 1 is a schematic plan view of a semiconductor test system in accordance with the present invention, FIG. 2A is a partial side view of the system shown in FIG. 1 with the test head horizontal and in its home position, FIG. 2B is a similar view of the test system with the test head raised from the home position and tilted from horizontal.

DETAILED DESCRIPTION

Figure 3:
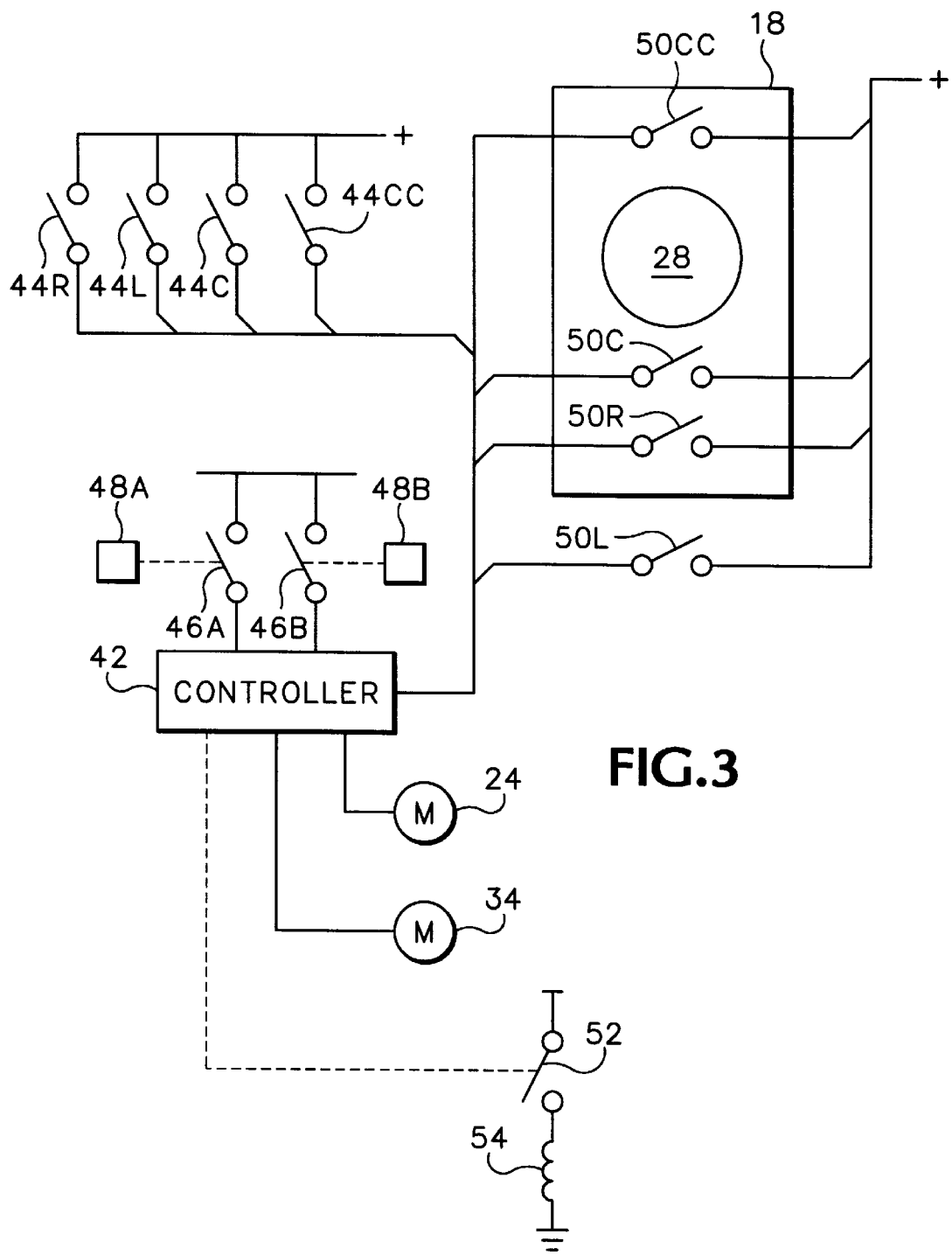
FIG. 3 is a block diagram illustrating a part of the test system shown in FIG. 1.

Referring particularly to FIG. 1, the illustrated semiconductor integrated circuit test system includes a device handler 10 which is generally similar to the MCT 7632 Fine Pitch Device Handler. The device handler 10 includes a mechanical support structure which supports the functional components of the handler. The mechanical support structure includes a frame 12 and a shell 14 which encloses several of the functional components.

The test system also includes a manipulator 16. Referring to FIGS. 2A and 2B as well as FIG. 1, the manipulator 16 includes a carriage 18 which is supported relative to the mechanical support structure of the handler by rails 20 running in linear guides 22 which are attached to the mechanical support structure. The rails 20 and guides 22 limit movement of the carriage 18 relative to the mechanical support structure to the vertical direction. A drive motor 24 (FIG. 3) is effective between the mechanical support structure and the carriage 18 for raising the carriage and controlling downward movement of the carriage.

A rotary bearing 26 is mounted in the carriage 18 and journals a shaft 28 for rotation about a horizontal axis. The shaft 28 projects from the carriage and carries a test head holder 30 at its free end. A test head 32 is fitted in the holder 30. A drive motor 34 (FIG. 3) is effective between the carriage 18 and the shaft 28 for rotating the shaft through a limited angular range.

The test head 32 contains pin cards 36 to which tester pins (not shown) are attached. Pin electronics circuits 38, which are fabricated using CMOS technology and are mounted on the pin cards, generate stimulus signals for application to a semiconductor integrated circuit device under test (DUT) and test or measure response signals from the DUT. A DUT board (not shown) mounted in the handler at a test station 40 is presented toward a DUT engagement face of the test head and is provided with a socket which receives the DUT and serves as an electrical interface between the tester pins and DUT.

The test head 32 has a home position (FIGS. 1 and 2A) in which the DUT engagement face is presented downward over the test station 40. The manipulator is able to raise the test head from its home position and, when the test head is raised, rotate the test head about the horizontal axis of the shaft 28 through an angle of 135° in the counterclockwise direction when viewed from the right of FIG. 1. This allows the socket to be positioned for manual interfacing between a device and the test head and also allows calibration and adjustment of the test head.

Movement of the test head 32 by the manipulator 16 is controlled by a controller 42 (FIG. 3). The controller 42 has an operator interface including four mode selection switches 44R, 44L, 44C and 44CC which are closed, e.g. by pressing suitable buttons, to establish the mode in which the test head 32 is to be moved. The four permitted modes are raise, lower, rotate clockwise and rotate counterclockwise and are invoked by closing the switches 44R, 44L, 44C and 44CC respectively. Suitable conditions apply to each mode. For example, neither rotate mode is permitted when the test head is in the home position.

The operator interface also includes two switches 46A and 46B which must both be closed in order to initiate movement of the carriage. The switches 46A and 46B are controlled by respective buttons 48A and 48B. If the user presses a button to close the switch 44 for a particular mode of movement and the mode is permitted, the operator then presses the two buttons 48 and the controller energizes the appropriate motor 24 or 34 to effect movement in the desired mode. If one or both switches 46 opens while the test head is moving, the controller immediately de-energizes the active motor and stops movement of the test head. The buttons 48 are spaced far enough apart that the operator cannot press both buttons with one hand. This helps to ensure that the test head will not move unless both the operator's hands are clear of the moving parts.

A limit switch 50R, 50L, 50C or 50CC closes when the test head reaches the end point of the mode of movement invoked by the switch 44R, 44L, 44C or 44CC, and when the controller 42 detects that a limit switch 50 has closed, it stops movement in the direction toward that end point. When the limit switch 50L associated with downward movement toward the home position closes, the controller opens a switch 52 which controls supply of current to a electromagnetic latch release mechanism 54. The electromagnetic latch release mechanism then releases a spring loaded latch for latching the test head to the handler. Conversely, when the operator depresses the raise button, thereby closing the switch 44R, and the controller determines that this is a permitted mode of movement because the limit switch 50L associated with the home position is closed, the controller 42 closes the switch 52 and the energizes the latch release mechanism 54 so as to disengage the latch and release the test head before energizing the motor 24 for raising the carriage.

During initial set-up, the limit switches 50 are adjusted in position to ensure that the end points of the modes of movement are at the desired positions relative to the frame of the handler. Thus, when the limit switches 50L and 50C associated with the home position and rotation in the clockwise direction are closed, the DUT engagement face of the test head is horizontal and the test head is in the home position.

The handler 10 has an input station 60 at which trays containing packaged devices to be tested are loaded into the handler. A transport mechanism (not shown) removes the devices from the trays and transports them to the test station 40 by way of an oven 62. The transport mechanism delivers the devices to the correct horizontal position at the test station 40 with a high degree of precision and repeatability. At the test station, the transport mechanism displaces the devices upward into engagement with the socket of the DUT board and the devices are tested. After testing, the transport mechanism transports the devices from the test station 40 to an output station 64 by way of an inspection station 66 at which the devices are inspected for any damage that might have occurred during testing. At the output station 64, the devices are put in trays on the basis of the result of the test and are removed from the handler for further processing.

The test system includes a power server 70 which is connected to the pin electronics circuits 38 in the test head 32 by a cable 72 which contains a common bus for all the pin electronics circuits 38 instead of several wires for each pin and is therefore relatively compact and light. Since the pin electronics circuits are not in the power server 70, the power server need not include special cooling facilities for the pin electronics circuits and therefore the power server itself is compact enough to be accommodated within the shell 14 of the handler. A location which is convenient and does not interfere with movement of the packaged devices from the input station to the output station is about halfway along the short side that is farther from the input station 60. This is convenient because it is reasonably close to the test head 32 and so the cable 72 extending from the power server to the test head can be short. Since the cable 72 is not bulky, it can be threaded through the interior of the handler and the carriage and through the shaft 28 to the test head.

When the power server 70 is located in the preferred position, the processing unit of the handler computer 80 can be positioned inside the handler shell 14 adjacent the input station 60. This location does not interfere with other functional components of the handler. The power server and the handler computer share an operator interface 74 (keyboard, mouse and display monitor) adjacent the input station of the handler. Since the shared operator interface of the power server and the handler computer is adjacent the input station, it is convenient for the operator to control the power server and the handler computer and observe the status of the power server and handler computer.

It will be seen from FIG. 1 that the manipulator 16 and power server 70 are within the footprint area of the handler 10 and therefore the floor area devoted to the entire test system is no larger than the floor area occupied by the handler alone.

It will be appreciated that the invention is not restricted to the particular embodiment that has been described, and that variations may be made therein without departing from the scope of the invention as defined in the appended claims and equivalents thereof.

I claim:

1. A semiconductor integrated circuit test system, for testing semiconductor integrated circuit devices, comprising:

a test head containing a plurality of pin electronics circuits, a device handler for receiving semiconductor integrated circuit devices to be tested and delivering the devices to a test station for engagement with the test head, the device handler including a mechanical support structure, a test head manipulator having a first part rigidly attached to the mechanical support structure of the device handler, a second part which is movable relative to the first part and to which the test head is attached, and a motor effective between the first and second parts of the manipulator for moving the second part relative to the first part, a power server attached to the device handler independently of the test head manipulator, and a cable connecting the power server to the pin electronics circuits of the test head.

2. A semiconductor test system according to claim 1, wherein the device handler defines a peripheral boundary of the test system and the power server is within the peripheral boundary.

3. A semiconductor test system according to claim 1, wherein the device handler is generally rectangular in plan, having two mutually parallel shorter sides and two mutually parallel longer sides perpendicular to the shorter sides, and the test head is located nearer to one of the longer sides than the other.

4. A semiconductor test system according to claim 3, comprising a handler computer for controlling operation of the handler and wherein the handler computer is located nearer to said other longer side than to said one longer side.

5. A test system according to claim 1, wherein the manipulator comprises a carriage which is movable in a single linear degree of freedom relative to the mechanical support structure and a test head holder which is movable relative to the carriage in a single rotational degree of freedom, and wherein the test head is attached to the test head holder.

6. A test system according to claim 1, wherein the test head has a DUT engagement face which is horizontal and faces downward when the test head is in a home position, for receiving devices to be tested, and the manipulator comprises a carriage which is movable vertically relative to the handler frame and a test head holder which is movable relative to the carriage in a single rotational degree of freedom and to which the test head is attached.

7. A test system according to claim 1, wherein the mechanical support structure includes a shell surrounding an interior space and the power server is located in said interior space.

8. A test system according to claim 1, wherein the first part of the test head manipulator includes linear guides attached to the mechanical support structure and the second part of the test head manipulator comprises rails running in the linear guides and a carriage supported by the rails for movement relative to the mechanical support structure along a linear axis.

9. A test system according to claim 8, wherein the carriage includes a rotary bearing defining an axis of rotation perpendicular to the axis of linear movement of the carriage and the test head manipulator further comprises a shaft journalled by the rotary bearing and a test head holder carried by the shaft and to which the test head is fitted.

* * * * *